(12) United States Patent
Hall (10) Patent No.: US 7,009,199 B2
(45) Date of Patent: Mar. 7, 2006

(54) ELECTRONIC DEVICES HAVING A HEADER AND ANTIPARALLEL CONNECTED LIGHT EMITTING DIODES FOR PRODUCING LIGHT FROM AC CURRENT

(75) Inventor: David Charles Hall, Raleigh, NC (US)

(73) Assignee: Cree, Inc., Durham, NC (US)

( * ) Notice: Subject to any disclaimer, the term of this patent is extended or adjusted under 35 U.S.C. 154(b) by 122 days.

(21) Appl. No.: 10/277,845

(22) Filed: Oct. 22, 2002

(65) Prior Publication Data

US 2004/0075399 A1 Apr. 22, 2004

(51) Int. Cl.
*H01L 33/00* (2006.01)

(52) U.S. Cl. .............................. 257/14; 257/94; 257/96; 257/97; 257/98; 257/101; 257/102; 257/103

(58) Field of Classification Search .................. 257/14, 257/18, 76, 77, 79–81, 94, 96–98, 101–103, 257/190, 613, 657, 673, 743, E21.112, E21.125, 257/E21.127, E21.131, E29.091, E29.104, 257/E33.008, E33.028, E33.035, E33.064, 257/E33.068

See application file for complete search history.

(56) References Cited

U.S. PATENT DOCUMENTS

| | | | |
|---|---|---|---|
| 4,918,497 A | 4/1990 | Edmond | 357/17 |
| 4,966,862 A | 10/1990 | Edmond | 437/100 |
| 5,006,908 A | 4/1991 | Matsuoka et al. | 357/17 |
| 5,027,168 A | 6/1991 | Edmond | 357/17 |
| 5,187,377 A | 2/1993 | Katoh | 257/89 |
| 5,210,051 A | 5/1993 | Carter, Jr. | 437/107 |
| 5,338,994 A | 8/1994 | Lezan et al. | 307/86 |

(Continued)

FOREIGN PATENT DOCUMENTS

EP 1020935 A 7/2000

(Continued)

OTHER PUBLICATIONS

"A Comparative Study of GaN Epilayers Grown on Sapphire and SiC Substrates □□by Plasma-Assisted Molecular-Beam Epitaxy", by M.E. Lin et al., Applied □□Physics Letters, vol. 62 (26), Jun. 28, 1993, pp. 3479-3481.*

(Continued)

*Primary Examiner*—Minhloan Tran
*Assistant Examiner*—Thomas L. Dickey
(74) *Attorney, Agent, or Firm*—Myers Bigel Sibley & Sajovec (57) ABSTRACT

A light engine comprises a pair of LED active elements mounted on a common header having first and second terminals. The first terminal is connected to the cathode of the first LED active element and the anode of the second LED active element, while the second terminal is connected to the anode of the first LED active element and the cathode of the second LED active element, thereby connecting the LEDs in an anti-parallel arrangement. A light engine having a single insulating or semi-insulating substrate having formed thereon plural LED active elements with associated p- and n-type contacts forming cathode and anode contacts, respectively, for each LED active element is also provided. The LED active elements may be mounted in a flip-chip configuration on a header having a plurality of leads. The header may include a pair of leads adapted such that two LEDs may be flip-mounted thereon with the anode of the first LED and the cathode of the second LED contacting one lead, while the cathode of the first LED and the anode of the second LED contact the other lead. In addition, the header may be adapted to permit a substrate having multiple active elements to be mounted thereon.

4 Claims, 5 Drawing Sheets

U.S. PATENT DOCUMENTS

| | | | |
|---|---|---|---|
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,912,447 A | 6/1999 | Bjorner et al. | 257/95 |
| 5,936,599 A | 8/1999 | Reymond | 345/82 |
| 5,982,345 A * | 11/1999 | Takayama et al. | 345/76 |
| 5,998,925 A | 12/1999 | Shimizu et al. | 313/503 |
| 6,013,199 A | 1/2000 | McFarland et al. | 252/301.4 |
| 6,066,681 A | 5/2000 | Kaplan et al. | 521/125 |
| 6,084,250 A | 7/2000 | Jüstel | 257/89 |
| 6,120,600 A | 9/2000 | Edmond et al. | 117/89 |
| 6,132,072 A | 10/2000 | Turnbull et al. | 362/494 |
| 6,187,606 B1 | 2/2001 | Edmond et al. | 438/46 |
| 6,201,262 B1 | 3/2001 | Edmond et al. | 257/77 |
| 6,388,393 B1 | 5/2002 | Illingworth | 315/291 |
| 6,414,662 B1 | 7/2002 | Havel | 345/83 |
| 6,498,355 B1 * | 12/2002 | Harrah et al. | 257/99 |
| 6,547,249 B1 * | 4/2003 | Collins et al. | 257/88 |
| 6,635,503 B1 | 10/2003 | Andrews et al. | 438/27 |
| 6,636,027 B1 | 10/2003 | Nerone | 323/364 |
| 6,740,906 B1 | 5/2004 | Slater, Jr. et al. | 257/99 |
| 6,747,298 B1 | 6/2004 | Slater, Jr. et al. | 257/200 |
| 2001/0032985 A1 | 10/2001 | Bhat et al. | 257/88 |
| 2002/0030444 A1 * | 3/2002 | Muller-Mach et al. | 313/512 |
| 2002/0070681 A1 | 6/2002 | Shimizu et al. | 315/246 |
| 2002/0123164 A1 | 9/2002 | Slater, Jr. et al. | 438/39 |
| 2002/0139987 A1 | 10/2002 | Collins, III et al. | 257/88 |
| 2003/0006418 A1 | 1/2003 | Emerson et al. | 257/79 |
| 2003/0045015 A1 | 3/2003 | Slater, Jr. et al. | 438/26 |
| 2003/0089918 A1 | 5/2003 | Hiller et al. | 257/98 |
| 2004/0029491 A1 | 2/2004 | Hubbell, III | 451/11 |
| 2004/0056260 A1 | 3/2004 | Slater, Jr. et al. | 257/79 |

FOREIGN PATENT DOCUMENTS

| | | |
|---|---|---|
| JP | 55148477 A | 11/1980 |
| JP | 57-167690 | 10/1982 |
| JP | 08172219 A | 11/1996 |
| JP | 11-016683 | 1/1999 |
| WO | WO 01/69978 A | 9/2001 |

OTHER PUBLICATIONS

"A Comparative Study of GaN Epilayers Grown on Sapphire and SiC Substrates □□by Plasma-Assisted Molecular-Beam Epitaxy", by M.E. Lin et al., Applied □□Physics Letters, vol. 62 (26), Jun. 28, 1993, pp. 3479-3481.*

*Light Emitting Diodes (LEDs) for General Illumination II: An OIDA Roadmap.* Optoelectronics Industry Development Association, Jul. 26, 2002, pp. 1-105.

Emerson, David, Provisional U.S. Appl. No. 60/294,308, filed May 30, 2001.

Emerson, David, Provisional U.S. Appl. No. 60/294,378, filed May 30, 2001.

Emerson, David, Provisional U.S. Appl. No. 60/294,445, filed May 30, 2001.

Hiller et al., Provisional U.S. Appl. No. 60/335,349, filed Oct. 31, 2001.

Glass et al., Provisional U.S. Appl. No. 60/307,235, filed Jul. 23, 2002.

Hubbell, Edward, Provisional U.S. Appl. No. 60/398,753, filed Jul. 26, 2002.

Slater et al., Provisional U.S. Appl. No. 60/411,980, filed Sep. 19, 2002.

International Search Report dated Aug. 18, 2004 or corresponding PCT application No. PCT/US03/31335.

* cited by examiner

ELECTRONIC DEVICES HAVING A HEADER AND ANTIPARALLEL CONNECTED LIGHT EMITTING DIODES FOR PRODUCING LIGHT FROM AC CURRENT

FIELD OF THE INVENTION

This invention relates to microelectronic devices and fabrication methods therefor, and more particularly to light emitting diodes (LEDs) and manufacturing methods therefor.

BACKGROUND

Light emitting diodes are widely used in consumer and commercial applications. As is well known to those having skill in the art, a light emitting diode generally includes a diode region on a microelectronic substrate. The microelectronic substrate may comprise, for example, silicon, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, low cost of operation, low heat generation, increased efficiency and other benefits may enable a variety of new display applications, and may place LEDs in a position to compete with the well entrenched incandescent and fluorescent lamps.

In certain applications, solid state lighting has already begun to displace traditional incandescent lighting. Most notably, many municipalities in the U.S. and abroad have started replacing traditional incandescent traffic signal bulbs with solid-state light engines. Although the initial cost of installation is relatively high, LED-based traffic signals have, generally, a substantially longer operational life and a far lower cost per lumen than traditional incandescent bulbs.

The move to LED-based traffic signals (particularly the red lights) was a natural beginning for the penetration of traditional incandescent and fluorescent markets by solid state light sources. High brightness red, yellow and, most recently, green LEDs have become available in the marketplace at a reasonable cost within the last decade. Recently, solid state white light engines have been finding applications in the automotive and cellular telephone industries as backlights for instrument panels, switches and LCD displays. Although the technology is still in its infancy, solid state white LEDs are now commercially available. Solid state white LEDs may be fabricated a number of ways. Current technology for providing solid state white lighting generally falls into one of three categories: color mixing, wavelength conversion and hybrid methods that combine aspects of color mixing and wavelength conversion.

Color mixing involves the synthesis of white light from a combination of light sources emitting complementary colors that combine to produce white light (for example, red, green and blue LEDs, or blue and yellow LEDs). Examples of color mixing are found in, for example, U.S. Pat. No. 6,132,072 and references cited therein. Wavelength conversion refers to the use of light of a first wavelength as the excitation signal to cause emission of light of a second wavelength (usually by a phosphorescent or fluorescent material). For example, a UV light source may be used to excite a phosphor capable of emitting red, green and blue light. The resulting light output of the phosphor is a combination of the three colors which, if properly balanced, appears white. See, e.g. U.S. Pat. No. 6,084,250.

White light may also be produced by methods that may be viewed as hybrids of color mixing and wavelength conversion. For example, a white emitter may be fabricated by coating a blue LED with a phosphor that emits yellow light upon excitation with blue light. The combination of blue light from the LED and excited yellow emission from the phosphor produces white light. Examples of phosphors for white light conversion may be found in U.S. Pat. Nos. 5,998,925, 6,066,681 and 6,013,199, which are hereby incorporated herein by reference. Other methods of producing solid state white light are possible.

Despite the availability of solid state white light sources, the vast majority of the market for white lighting applications (namely, home and office lighting) remains relatively untapped. Part of the reason for this is that LEDs are typically not directly compatible with existing power distribution networks.

Existing power distribution networks provide high-voltage (110V or 220V) low current power to homes and businesses in the form of alternating current (AC). "AC" means that the polarity (i.e. direction) of the supplied current alternates with each cycle. For standard 60 Hz power supplies, this means that the polarity of the current changes 120 times per second.

In contrast, LEDs are low-voltage, high-current devices that by their nature permit current flow in only one direction, and hence, are considered direct current (DC) devices. Thus, efficient power distribution or transformation systems capable of powering LED-based lighting systems may be beneficial in achieving penetration into traditional white lighting markets. In fact, one draft technology roadmap for solid state white lighting indicates that power supplies and drive electronics that transform 100 Volts (AC) to 2–5 Volts (DC) with 95% efficiency should be a goal of the solid state lighting industry in order to achieve high market penetration See "Light Emitting Diodes for General Illumination II", J. Tsao, Editor (Final Draft—Jul. 26, 2002).

Attempts have been made to design systems capable of emitting light from LEDs using an AC power source. For example, U.S. Pat. No. 5,936,599 discloses an AC powered LED array circuit for use in traffic signal displays, as well as a number of prior art circuits for similar application. In particular, the '599 patent describes a circuit having a plurality of LED pairs connected in an anti-parallel fashion to permit current flow in both halves of an AC cycle. The connection of LEDs in an anti-parallel configuration is well known. However connection of packaged LEDs in this configuration typically consumes an excessive amount of space. Moreover, the system designer may need to design complex interconnections within the luminaire to implement this design using available LED technology. A more flexible approach for designing solid state light sources for AC operation is desired.

SUMMARY OF THE INVENTION

Embodiments of the present invention provide a light engine comprising a pair of LED active elements mounted on a common header having first and second terminals. The first terminal is connected to the cathode of the first LED active element and the anode of the second LED active element, while the second terminal is connected to the anode of the first LED active element and the cathode of the second LED active element. The LED active elements may be provided on a common substrate, separate substrate and/or combinations of common and separate substrates.

Other embodiments of the invention provide a light engine comprising a single insulating or semi-insulating substrate having formed thereon plural LED active elements with associated p- and n-type contacts forming a cathode and an anode, respectively, for each LED active element. The device may be mounted in a flip-chip configuration to increase light Output and potentially eliminate the need for wirebonding.

In other embodiments of the present invention, a header having a pair of leads adapted such that at least two LED active elements may be flip-mounted thereon with the anode of the first LED active element and the cathode of the second LED active element contacting one lead, while the cathode of the first LED active element and the anode of the second LED active element contact the other lead. In addition, the header may be adapted to permit a substrate having multiple active elements to be mounted thereon.

Further embodiments of the invention provide substrates having shaped or textured features to improve light extraction efficiency and phosphor coatings to perform wavelength conversion.

Additional embodiments of the present invention provide methods of fabricating LED light engines as recited herein.

DETAILED DESCRIPTION

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings are illustrated in exaggerated dimensions for clarity of drawing and ease of explanation.

Embodiments of the invention now will be described, generally with reference to gallium nitride-based light emitting diodes on silicon carbide-based substrates. However, it will be understood by those having skill in the art that many embodiments of the invention may be employed with many different combinations of substrate and epitaxial layers. For example, combinations can include AlGaInP diodes on GaP substrates; InGaAs diodes on GaAs substrates; AlGaAs diodes on GaAs substrates; SiC diode on SiC or sapphire ($Al_2O_3$) substrate; and/or a nitride-based diodes on gallium nitride, silicon carbide, aluminum nitride, sapphire, zinc oxide and/or other substrates.

Embodiments of the invention include an LED light engine capable of efficiently emitting light using an AC power source. In certain embodiments, the light engine comprises a pair of LEDs mounted on a header having first and second terminals. The first terminal is connected to the cathode of the first LED and the anode of the second LED, while the second terminal is connected to the anode of the first LED and the cathode of the second LED. The LEDs may be mounted in an epi-up configuration or in a substrate-up (flip-chip) configuration.

In other embodiments, the light engine comprises a single substrate having at least two LED active elements with associated p- and n-type contacts forming a cathode and an anode, respectively, for each LED active element. The device may be mounted in a flip-chip configuration to increase light output and eliminate the need for wirebonding.

In further embodiments of the present invention, a header has a pair of leads adapted such that two LEDs (which may be identical) may be flip-mounted with the anode of the first LED and the cathode of the second LED contact one lead, while the cathode of the first LED and the anode of the second LED contact the other lead. Additional embodiments permit the attachment and interconnection of more than two LEDs or LED active elements on a single header. External circuit elements such as circuits for ESD protection, power conversion, power matching or other purposes may be mounted on the header alongside the LEDs for more efficient and flexible system integration.

Figure 1:
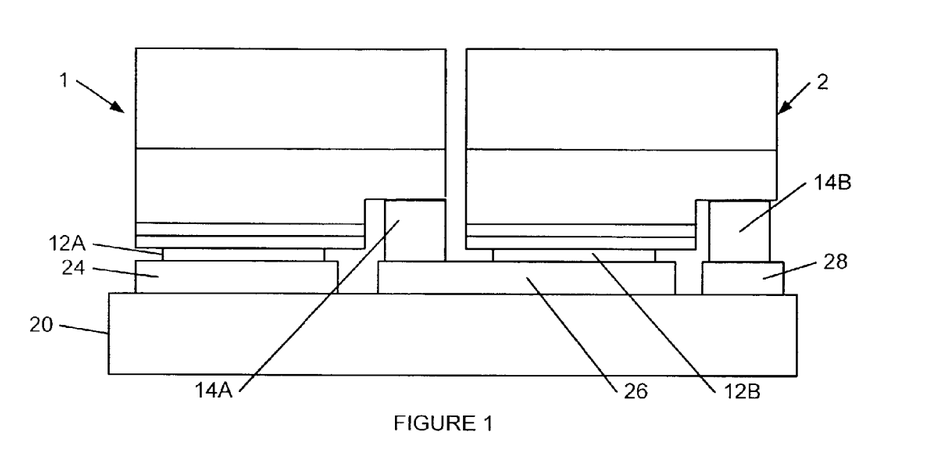
FIG. 1 is a side view of certain embodiments of the invention.

Particular embodiments of the invention are shown in FIG. 1, which illustrates a header or lead frame 20 on which LEDs 1 and 2 are mounted in a flip-chip configuration in which the device is mounted with the substrate side away from the header and the epitaxial region adjacent to the header.

Figure 2A:
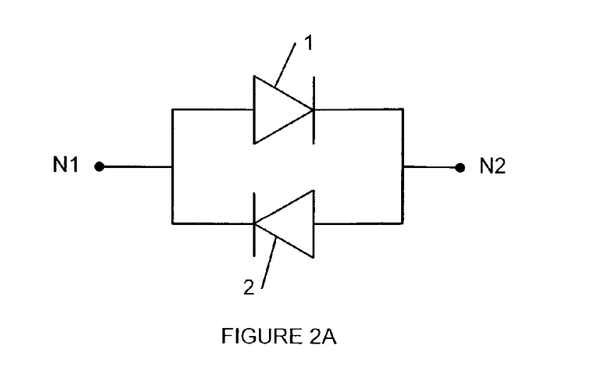
FIG. 2A is an equivalent circuit of the embodiments shown in FIG. 1.
Figure 2B:
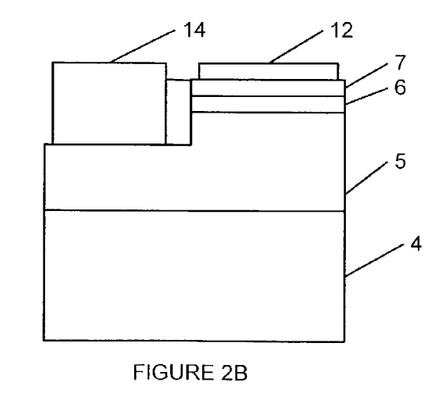
FIGS. 2B and 2C are side and top views, respectively, of an LED that may be used in connection with certain embodiments of the invention.
Figure 2C:
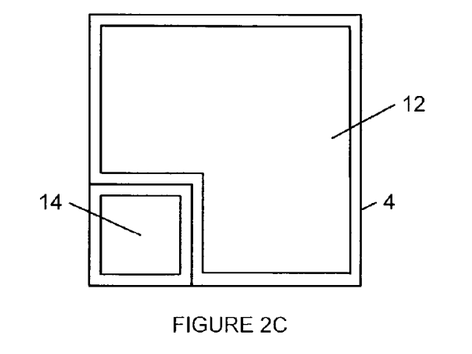

Exemplary LED structures are shown in FIGS. 2B and 2C. As illustrated in FIG. 2B, an exemplary LED for use in connection with the present invention may comprise a substrate 4 on which is formed an epitaxial region comprising an n-type contact layer 5, an active region 6 and a p-type contact layer 7. The term "on" is not used narrowly to refer only to direct physical contact. In contrast, as the terms is used herein, a layer may be on another layer even if the layers are not in direct physical contact.

Substrate 4 may comprise any of the aforementioned substrate materials but in certain embodiments comprises 6H-silicon carbide. The epitaxial region may comprise gallium nitride-based semiconductor layers. Active region 6 may comprise a homojunction, single heterostructure, double heterostructure or single or multiple quantum well structure. Other layers (not illustrated) may be present in the device as well. Ohmic contacts 12 and 14 are formed on the p-type and n-type contact layers 7 and 5 to form anode and cathode electrical contacts, respectively. FIG. 2C is a top view of the exemplary LED chip of FIG. 2B showing one possible configuration of anode and cathode contacts 12 and 14. The design and fabrication of epitaxial layers and ohmic contacts for gallium nitride-based LEDs is well known in the art. For example, embodiments of the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. Provisional Patent Application Ser. No. 60/294,378, entitled "LIGHT EMITTING DIDODE STRUCTURE WITH MULTI-QUANTUM WELL AND SUPERLATTICE STRUCTURE", U.S. Provisional Patent Application Ser. No. 60/294,445, entitled "MULTI-QUANTUM LIGHT EMITTING DIODE STRUCTURE" and U.S. Provisional Patent Application Ser. No. 60/294,308, entitled "LIGHT EMITTING DIDODE STRUCTURE WITH SUPERLATTICE STRUCTURE", each filed May 30, 2001, U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. Provisional Patent Application Ser. No. 10/057, 82, entitled "LIGHT EMITTING DIODES INCLUDING SUBSTRATE MODIFICATIONS FOR LIGHT EXTRACTION AND MANUFACTURING METHODS THEREFOR" filed Jul. 23, 2001 and U.S. patent application Ser. No. 10/057,82, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR." the disclosures of which are incorporated herein as if set forth fully. Furthermore, phosphor coated LEDs, such as those described in U.S. Provisional Application Ser. No. 60/411,980 entitled "PHOSPHOR-COATED LIGHT EMITTING DIODES INCLUDING TAPERED SIDEWALLS, AND FABRICATION METHODS THEREFOR," filed Sep. 19, 2002, the disclosure of which is incorporated by reference herein as if set forth full, may also be suitable for use in embodiments of the present invention.

Returning to FIG. 1, header 20 includes conductive leads 24, 26 and 28, with leads 24 and 28 being electrically connected to one another. LED 1 is mounted so that its cathode 12A is in electrical contact with lead 24 while its anode 14A is in electrical contact with lead 26. LED 2 is mounted such that its cathode 12B is in electrical contact with lead 26, while its anode 14B is in electrical contact with lead 28. Since lead 28 is in electrical contact with lead 24, the cathode of LED 1 is in electrical contact with the anode of LED 2. Lead 24 acts as common node N1 shown in FIG. 2A, while lead 26 acts as node N2. As used herein, "electrical contact" means direct contact in a manner that permits electrical flow or indirect contact through intervening elements that are themselves electrically conductive.

LEDs 1 and 2 may be attached to the leads 24, 26 and 28 by soldering or thermosonic bonding, examples of which are set forth in U.S. patent application Ser. No. 10/185,350 filed Jun. 27, 2002 entitled "Bonding of Light Emitting Diodes Having Shaped Substrates and Collets Bonding of Light Emitting Diodes Having Shaped Substrates," U.S. patent application Ser. No. 10/185,252 filed Jun. 27, 2002 entitled "Flip-Chip Bonding of Light Emitting Devices and Light Emitting Devices Suitable for Flip-Chip Bonding," and/or U.S. patent application Ser. No. 10/200,244 filed Jul. 22, 2002 entitled "Light Emitting Diodes Including Modifications for Submount Bonding and Manufacturing Methods Therefor,", each of which is incorporated herein by reference in its entirety as if set forth fully herein. Since LEDs 1 and 2 have both cathode and anode contacts on the same side of the chip in this embodiment, they may be constructed on conductive substrates and/or insulating or semi-insulating substrates, such as semi-insulating SiC or sapphire.

A schematic of the circuit created by the LEDs is shown in FIG. 2A, which illustrates the connection of two LEDs in antiparallel fashion. The cathode of LED 1 is connected to node A along with the anode of LED 2. Likewise, the cathode of LED 2 is connected to node B along with the anode of LED 1. When an AC voltage is applied across nodes N1 and N2, LEDs 1 and 2 will be energized on alternating halves of the AC waveform.

Because LEDs have nonzero persistence, it will appear to an observer as though both LEDs are "on" simultaneously if the frequency of oscillation is high enough. As used herein, "persistence" of an LED refers to the amount of time an LED appears to continue to emit light after the drive voltage on the LED is removed or reversed.

Figure 3:
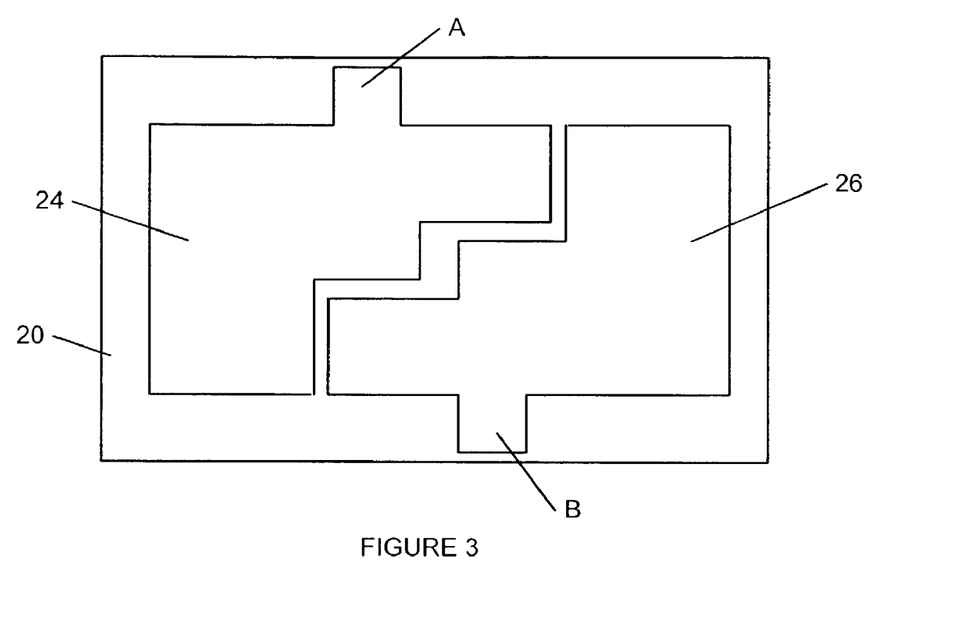
FIG. 3 is a top view of an exemplary header according to embodiments of the invention.

As illustrated in FIG. 3, a header 20 has a pair of leads adapted such that two LEDs (which may be identical) may be flip-mounted with the anode of the first LED and the cathode of the second LED contacting one lead, while the cathode of the first LED and the anode of the second LED contact the other lead. Thus, the first contact 24 and the second contact 26 provide an interdigited or interlocking contacts, each of which overlaps with a region where LED 1 contacts the header 20 and a region where LED 2 contacts the header 20 such that a single contact region may compactly contact both LED 1 and LED 2. Tabs A and B may be used for bonding or otherwise electrically connecting the device to external circuitry.

In addition, external circuit elements (not shown) for providing ESD protection, power conversion, power matching or other purposes may be mounted on the header alongside the LEDs and electrically connected to the leads for more efficient and flexible system integration. Such circuit elements may include passive elements such as resistors, inductors and capacitors or active elements such as transistors.

Figure 4:
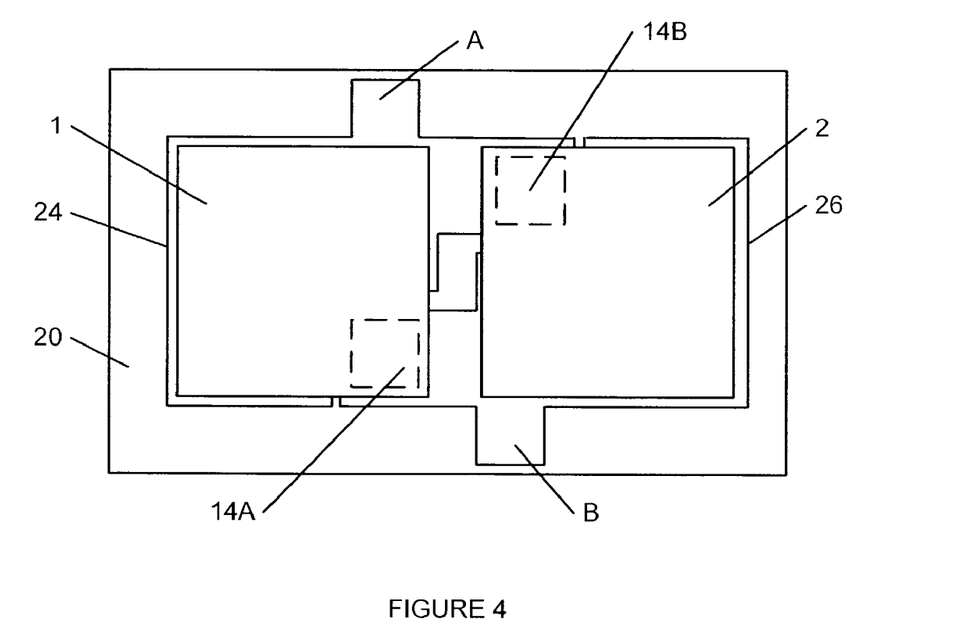
FIG. 4 is a top view of an exemplary header according to embodiments of the invention and including a pair of LEDs mounted thereon.

FIG. 4 is a top view of a pair of LEDs 1 and 2 mounted on the header shown in FIG. 3. FIG. 4 illustrates the connection between cathodes 14A and 14B and leads 24 and 26, respectively.

Figure 5:
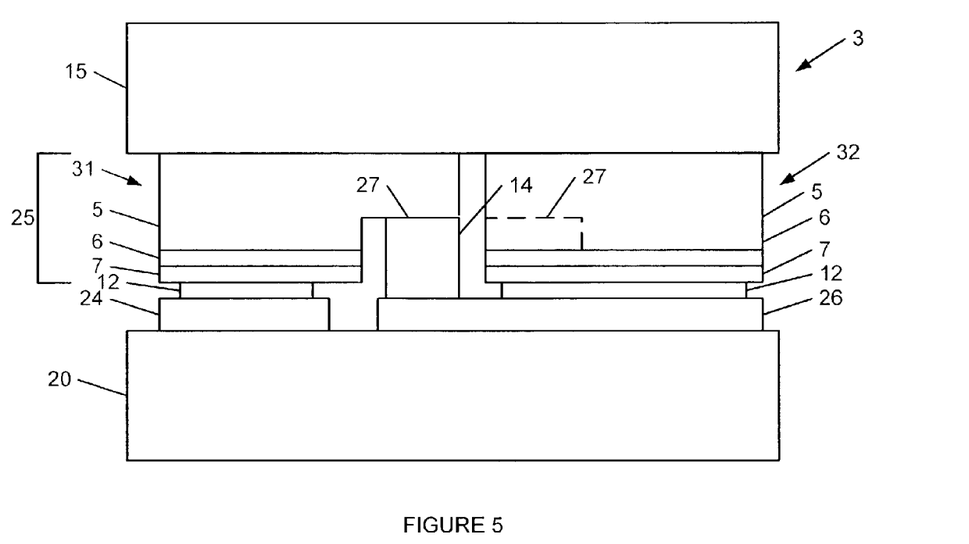
FIG. 5 is a side view of further embodiments of the invention.
Figure 6:
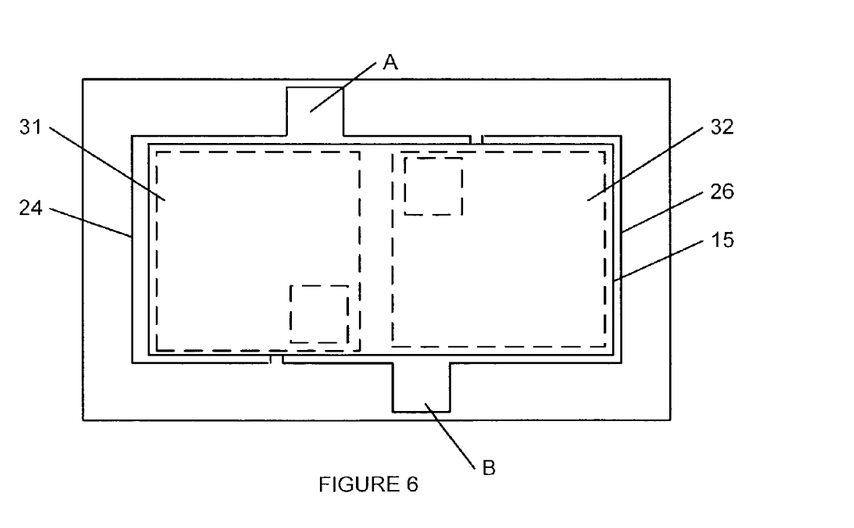
FIG. 6 is a top view of an exemplary header according to embodiments of the invention and including the device illustrated in FIG. 5 mounted thereon.

Further embodiments of the present invention are shown in FIG. 5. In the embodiments illustrated in FIG. 5, an LED 3 having plural active elements 31 and 32 is fabricated on a single substrate 15. Substrate 15 may be semi-insulating or insulating to prevent the cathodes of the devices from short circuiting. Elements 31 and 32 each comprise an n-type contact layer 5, an active region 6 and a p-type contact layer 7, as well as ohmic contacts 12 and 14 to the p-type and n-type contact layers 7 and 5, respectively. FIG. 6 illustrates a top view of the device 3 mounted on a header 20.

In the embodiments illustrated in FIGS. 5 and 6, device 3 may be fabricated by depositing appropriate epitaxial layers on a substrate 15, patterning the layers using an etch mask, and etching a portion of the epitaxial layers to form active elements 31 and 32 as isolated mesa regions on the substrate 15. Other methods may be used to isolate active elements on the substrate. Individual die may then be sawn and separated as desired. Further details on possible device fabrication processes are described in U.S. patent application Ser. No. 10/058,369 entitled "CLUSTER PACKAGING OF LIGHT EMITTING DIODES," filed Jan. 28, 2002 and/or U.S. Provisional Patent Application Ser. No. 60/398,753 filed Jul. 26, 2002 entitled "Methods, Systems and Computer Program Products for Controlling a Semiconductor Dicing Saw" which is incorporated herein by reference as if set forth fully herein.

Figure 7:
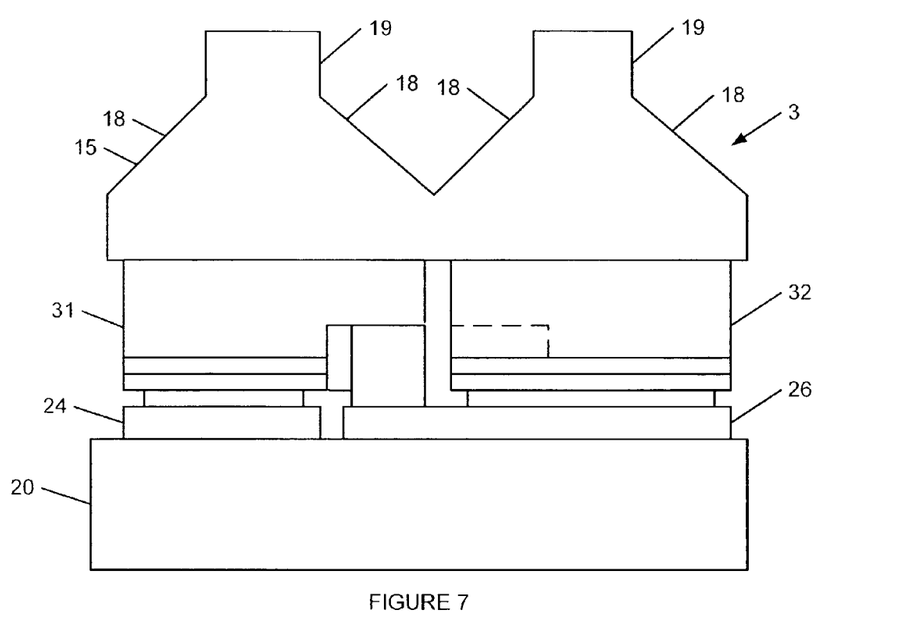
FIG. 7 is a side view of further embodiments of the invention.

To improve light output, the substrate 15 maybe shaped as described in U.S. patent application Ser. No. 10/057,821 filed Jan. 25, 2002 entitled "Light Emitting Diodes Including Substrate Modifications for Light Extraction and Manufacturing Methods Therefor" which is assigned to the assignee of the present invention and which is incorporated herein by reference in its entirety as if set forth fully herein. One possible shaping is Illustrated in FIG. 7, in which the substrate 15 is provided with a plurality of slanted sidewalls 18 and pedestals 19 which may function to increase the probability that a given light ray striking the surface of the substrate will escape. The surface of the substrate may also be roughened, textured or otherwise patterned with micro-optical features to improve light extraction efficiency.

In addition, the substrate may be encapsulated in or coated with phosphorescent material to facilitate the generation of white or other color light in the manner generally described above or to increase the persistence of the LEDs. For example, the substrate may be coated with a phosphorescent material as described in U.S. Provisional Patent Application Ser. No. 60/335,349 filed Oct. 31, 2001 entitled "Broad Spectrum LED Devices and Methods, and Systems for Fabricating the Same" which is incorporated herein by reference in its entirety as if set forth fully herein.

Figure 8:
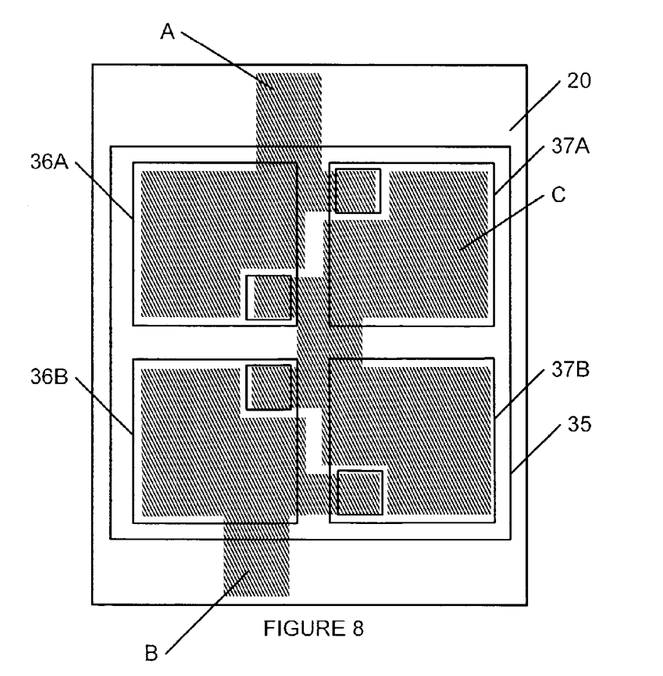
FIG. 8 is a top view of an exemplary header according to embodiments of the invention and including an LED device having four active elements mounted thereon.
Figure 9:
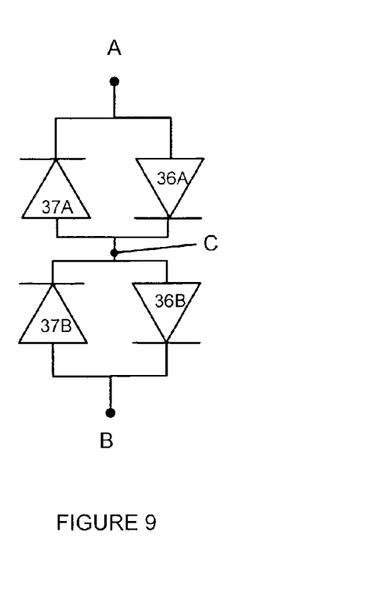
FIG. 9 is an equivalent circuit of the embodiments shown in FIG. 8.

In other embodiments, more than two active elements may be formed on a single substrate and interconnected to form a desired configuration in the manner described above in connection with FIGS. 5 and 6. For example, FIG. 8 is a top view of a device comprising a header 20 on which the contacts A, B and C (shown in crosshatch) are formed. An LED comprising a substrate 35 including four active elements 36A, 36B, 37A and 37B is mounted on the header 20 such that the cathode of element 37A and the anode of element 37B are connected to the contact A, the anodes of elements 37A and 36B are connected to the contact C along with the cathodes of elements 36A and 37B, and the anode of element 37B and the cathode of element 36B are connected to the contact B. The equivalent circuit for these particular embodiments is illustrated in FIG. 9. As shown in FIG. 9, this circuit comprises two pairs of LEDs connected in serial, wherein each pair comprises two LEDs connected in an anti-parallel configuration.

Figure 10:
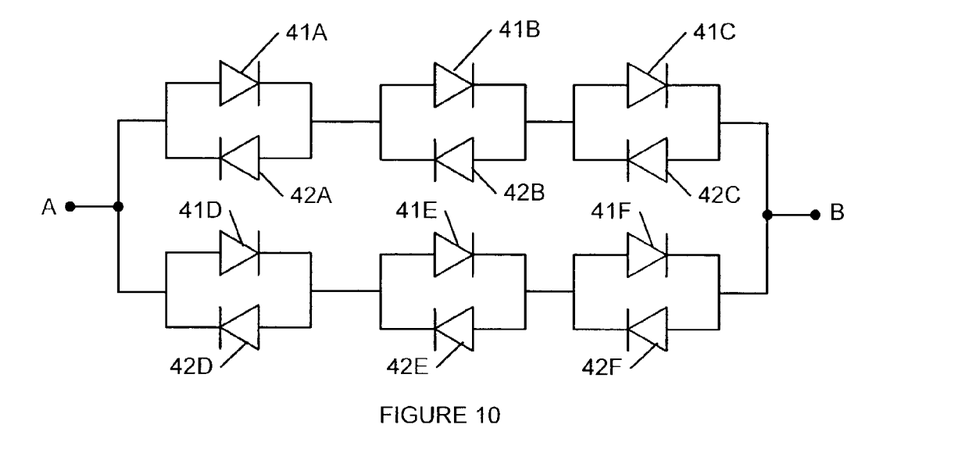
FIG. 10 is an equivalent circuit of the embodiments shown in FIG. 11.

Other configurations may be easily realized. For example, FIG. 10 illustrates a more complicated circuit comprising two parallel chains of three anti-parallel LED pairs. This circuit may be implemented by the configuration shown in FIG. 11 which comprises a header 20 on which an LED comprising a substrate 45 including twelve active elements 41A through 41F and 42A through 42F. For simplicity, the contacts on the header 20 are not shown explicitly but are represented by schematic lines 46.

Since the interconnection of active elements on the LED is accomplished through the design of contacts on header 20, a large number of configurations may be easily realized merely by changing the design and layout of contacts on the header 20. This provides the system designer with flexibility in designing the electrical characteristics of the light engine to match a desired application.

Methods in accordance with the present invention may be understood in reference to FIG. 5. A method of manufacturing a light emitting device in accordance with the present invention comprises providing a semi-insulating or insulating substrate 15; forming an epitaxial region 25 on the substrate, wherein the epitaxial region comprises at least a n-type contact layer 5 on the substrate 15, an active region 6 on the n-type contact layer 5, and a p-type contact layer 7 on the active region 6. A first etch mask is applied to the epitaxial region 25, and the epitaxial region 25 is selectively etched to reveal a plurality of contact areas on the n-type contact layer 5. A plurality of active elements 31, 32 are isolated within the epitaxial region 25 such that each active element includes at least one revealed contact area 27 of the n-type contact layer 5. The isolation may be performed by a second etch step or by other isolation techniques known in the art. The anode 12 and cathode 14 ohmic contacts are formed on the p-type contact layers 7 and the n-type contact layers 5 of each of the active elements 31, 32.

Figure 11:
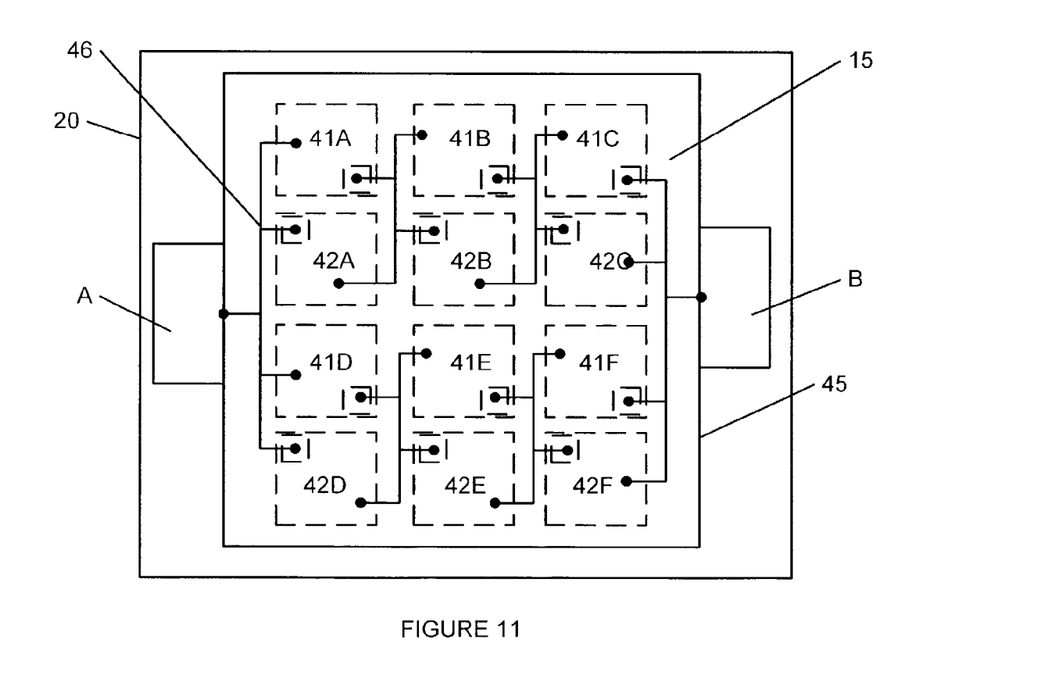
FIG. 11 is a partial schematic top view of an exemplary header according to embodiments of the invention and including an LED device having twelve active elements mounted thereon.

Although a device having only two active elements 31, 32 is illustrated in FIG. 5, it is possible to extend the method described above to fabricate a device having a greater number of active elements, such as the device illustrated in FIG. 11.

The device 3 having plural active elements 31, 32 formed thereon may be mounted on a header 20, as described above, having conductive leads such that each of the anode and cathode ohmic contacts of the plural active elements is in electrical contact with at least one lead. Further, the substrate 15 may be shaped to improve light extraction as described above. The substrate 15 may be coated with a wavelength converting material to produce white or other colored light in the manner described above, or the entire device may be encapsulated with a material containing a wavelength converting material.

In the drawings and specification, there have been disclosed embodiments of the invention, and, although specific terms have been employed, they have been used in a generic and descriptive sense only and not for purposes of limitation.

That which is claimed is:

1. An electronic device, comprising:

a header;

a plurality of LED active elements mounted on the header in a flip-chip configuration, wherein at least one of the LED active elements has associated therewith a coating of a wavelength conversion material;

wherein the header is configured to electrically connect respective pairs of the plurality of active elements in anti-parallel manner; and wherein the respective first and second active elements of the respective pairs are configured to be energized on respective alternating halves of an Alternating Current (AC) waveform so as to emit light from the respective first and second active elements on respective alternating halves of the AC waveform, wherein the plurality of LED active elements comprise a plurality of discrete LEDs, each of the plurality of discrete LEDs being mounted in a flip-chip configuration on the header.

2. The electronic device of claim 1, wherein the header is further configured to serially electrically connect pairs of the plurality of active elements that are connected in an anti-parallel manner.

3. The electronic device of claim 1, wherein the header is further configured to parallel electrically connect the serially electrically connected pairs of the plurality of active elements that are connected in an anti-parallel manner.

4. The electronic device of claim 1, wherein the header comprises conductive leads disposed to contact adjacent ones of the plurality of active elements such that at least two conductive leads are disposed between each of the plurality of active elements and a substrate of the header.

* * * * *